(12) United States Patent
Ogawa et al.

(10) Patent No.: US 8,018,359 B2
(45) Date of Patent: Sep. 13, 2011

(54) CONVERSION OF BIT LENGTHS INTO CODES

(75) Inventors: Makoto Ogawa, Yamato (JP); Tadayuki Okada, Yamato (JP); Kiyoshi Takemura, Yamato (JP); Nobuyoshi Tanaka, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/753,784

(22) Filed: Apr. 2, 2010

(65) Prior Publication Data

US 2010/0265110 A1    Oct. 21, 2010

(30) Foreign Application Priority Data

Apr. 21, 2009   (JP) .................................. 2009-103213

(51) Int. Cl.
*H03M 7/46*  (2006.01)
(52) U.S. Cl. ................. 341/63; 341/65; 341/67
(58) Field of Classification Search ............ 341/63, 341/65, 67
See application file for complete search history.

(56) References Cited

U.S. PATENT DOCUMENTS 5,614,900 A * 3/1997 Watanabe ..................... 341/67
6,157,326 A   12/2000 Van Der Vleuten et al.
6,573,847 B1 * 6/2003 Wang ........................... 341/67

FOREIGN PATENT DOCUMENTS

| JP | 2050667 B | 11/1990 |
|----|-----------|---------|
| JP | 7106981 A | 4/1995 |
| JP | 7177039 A | 7/1995 |
| JP | 7184202 A | 7/1995 |
| JP | 2000-261324 | 9/2000 |
| JP | 2002515201 T | 5/2002 |
| JP | 2002-271208 | 9/2002 |
| JP | 2006222626 A | 8/2006 |

OTHER PUBLICATIONS

English Translation of Background Art cited in Office Action (NoA) mailed May 17, 2011 for counterpart JP Application No. 2009-103213.

* cited by examiner

*Primary Examiner* — Khai M Nguyen
(74) *Attorney, Agent, or Firm* — Griffiths & Seaton PLLC

(57) ABSTRACT

Various embodiments are provided to reduce a processing time taken when plural bit lengths each assigned to plural strings are converted into plural codes. In one exemplary embodiment, in response to input of the plurality of bit lengths, a number of strings assigned each of the bit lengths, a bit length assigned to each of the strings, and a sequence number of each string in a group of strings assigned each of the bit lengths are recorded. A plurality of base codes are generated on the basis of the numbers of the strings recorded by the recording unit, the base codes each being a code used as a base for codes having the same one of the bit lengths. A plurality of codes is generated by performing in parallel a plurality of processes respectively for the plurality of strings.

13 Claims, 9 Drawing Sheets

| CHARACTER | BIT LENGTH | CODE |
|---|---|---|
| A | 3 | 010 |
| B | 3 | 011 |
| C | 3 | 100 |
| D | 3 | 101 |
| E | 3 | 110 |
| F | 2 | 00 |
| G | 4 | 1110 |
| H | 4 | 1111 |

(a)
bl_count[1]     B1
bl_count[2]     B2 B2
bl_count[3]     B3 B3 B3
bl_count[4]     B4 B4 B4 B4
bl_count[5]     B5 B5 B5 B5 B5
                ....
bl_count[13]    B13 B13 B13 B13 B13 B13 B13 B13
bl_count[14]    +B14 B14 B14 B14 B14 B14 B14 B14
                ─────────────────────────────────────────
code_min[15]    C15 C15 C15 C15 C15 C15 C15 C15 C15 C15 C15 C15 C15 C15 C15

(b)
bl_count[1]     B1
bl_count[2]     B2 B2
bl_count[3]     B3 B3 B3
bl_count[4]     B4 B4 B4 B4
bl_count[5]     B5 B5 B5 B5 B5
                ....
bl_count[13]                                B13 B13 B13 B13 B13 B13 B13 B13
bl_count[14]    +                           B14 B14 B14 B14 B14 B14 B14 B14
                ─────────────────────────────────────────
code_min[15]    C15 C15 C15 C15 C15 C15 C15 C15 C15 C15 C15 C15 C15 C15 C15

FIG. 8

| CHARACTER | BIT LENGTH | COMPUTATION EQUATION | CODE |
|---|---|---|---|
| A | 3 | 000 + 010 = 010 | 010 |
| B | 3 | 001 + 010 = 011 | 011 |
| C | 3 | 010 + 010 = 100 | 100 |
| D | 3 | 011 + 010 = 101 | 101 |
| E | 3 | 100 + 010 = 110 | 110 |
| F | 2 | 00 + 00 = 00 | 00 |
| G | 4 | 0000 + 1110 = 1110 | 1110 |
| H | 4 | 0001 + 1110 = 1111 | 1111 |

FIG. 9

CONVERSION OF BIT LENGTHS INTO CODES

CLAIM TO FOREIGN PRIORITY

The present application claims priority to Japanese Patent Application No. 2009-103213, filed Apr. 21, 2009, and entitled "Circuit for and Method of Converting Bit Lengths into Codes."

BACKGROUND OF THE INVENTION

1. Field of the Invention

The present invention relates in general to computers, and provides exemplary embodiments for converting bit lengths into codes. Particularly, the present invention relates to mechanisms for converting plural bit lengths, each assigned to plural strings, into plural codes respectively having the plural bit lengths.

2. Description of the Related Art

Deflate compression is a compression method based on which data compression formats widely used in computers at present, i.e., zlib and gzip (GNU zip) are specified. In this method, data is compressed by use of a coding technique called Huffman coding. In Huffman coding, byte-based characters repeatedly appearing in data are assigned variable-length codes in accordance with frequencies of appearance of the respective byte-based characters. In this regard, more efficient coding can be carried out by assigning codes of shorter bit lengths to more frequently appearing characters, and codes of longer bit lengths to less frequently appearing characters.

In Huffman coding, a Huffman table that retains codes assigned to respective characters is produced, and added to compressed data. Then, the compressed data is decoded with reference to this Huffman table. However, in the case where a Huffman table is thus added to compressed data, a compression rate drops if the size of this Huffman table is large. In order to improve the compression rate, this Huffman table itself is compressed in deflate compression.

Specifically, in deflate compression, a Huffman table does not retain codes respectively assigned to characters, but retains lengths (bit lengths) of the codes assigned to the characters. If the ASCII code sequence is employed to define which codes to assign to respective characters in a group with the same bit length (that is, the alphabetical order is employed when characters to be coded are alphabets), the codes assigned to the characters can be uniquely determined based on the bit length. For example, let's consider a case where bit lengths assigned to A, C and D are all "3". In this case, once a code of "A" is determined as "100", C and D can be determined as "101" and "110" by incrementing the immediately preceding code by "1".

Heretofore, several techniques relating to decoding of data coded by use of a Huffman table have been proposed. A first technique described in the literature proceeds as follows. First, it is determined whether codes to be decoded are coded by using a standard Huffman table or a nonstandard Huffman table. Then, if the codes are determined as coded by using the standard Huffman table, a standard decoding circuit decodes the codes by using the standard Huffman table, whereas, if the codes are determined as coded by using the nonstandard Huffman table, software processing means decodes the codes by using the nonstandard Huffman table. A second technique described in the literature provides a method for performing Huffman decoding in reduced time by testing for the length of valid Huffman codes in a compressed data stream, and using an offset corresponding to a test criterion.

SUMMARY OF THE INVENTION

In order to decode a Huffman table compressed in the abovementioned manner, it is necessary to take the following three steps of:

(1) computing a frequency at which each bit length is used;
(2) computing a minimum code in each bit length; and
(3) assigning codes.

However, if these steps are performed by hardware, the processing must be performed iteratively by the number of bit lengths in the step (2), and by the number of the codes in the step (3). For this reason, a processing time increases if the number of the codes is large. Incidentally, the exemplary techniques described above are not made in view of such problems that occur in a case of generating a Huffman table in which characters are assigned bit lengths, and of decoding the characters on the basis of the bit lengths. In view of the foregoing, a need exists for a mechanism reducing processing time taken when plural bit lengths, each assigned to plural strings, are converted into plural codes.

Accordingly, exemplary embodiments are provided for converting plural bit lengths, each assigned to plural strings, into plural codes respectively having the plural bit lengths. In one exemplary embodiment, by way of example only, a method for converting the plurality of bit lengths is provided. In response to input of the plurality of bit lengths, a number of strings assigned each of the bit lengths, a bit length assigned to each of the strings, and a sequence number of each string in a group of strings assigned each of the bit lengths are recorded. A plurality of base codes is generated on the basis of the numbers of the recorded strings, the base codes each being a code used as a base for codes having the same one of the bit lengths. A plurality of codes are generated by performing in parallel a plurality of processes respectively for the plurality of strings, one of the processes for each of the strings being based on one of the plurality of generated base codes, the one base code having a bit length that is assigned to the string, and the sequence number for the string in the group of the strings assigned the bit length.

In addition to the foregoing exemplary embodiment, various other method, system and computer program product embodiments are disclosed and provide related advantages.

BRIEF DESCRIPTION OF DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIGS. 8A and 8B are diagrams showing an optimization method of the minimum code computing circuit of the Huffman table decoding circuit in the embodiment of the present invention;

FIG. 9 is a diagram provided for explaining an assigned-code computing circuit of the Huffman table decoding circuit in the embodiment of the present invention;

DETAILED DESCRIPTION OF THE DRAWINGS

Figure 1:
FIG. 1 is a diagram showing compression of a Huffman table.

FIG. 1 is a diagram showing a compressing method of a specific example of a Huffman table used in the embodiment of the present invention. In the drawing, a table to the left of a bold arrow is the Huffman table before compression, and a table to the right of the bold arrow is the Huffman table after compression. That is, although codes are respectively assigned to characters in the Huffman table before compression, bit lengths of the codes, instead of the codes, are respectively assigned to the characters in the Huffman table after compression.

Specifically, "3" instead of "010", "011", "100", "101" and "110" is assigned to A, B, C, D and E, "2" instead of "00" is assigned to F, and "4" instead of "1110" and "1111" is assigned to G and H. Note that, although, in general, codes or bit lengths can be each assigned to strings, description in the embodiment of the present invention assumes that codes or bit lengths are assigned to respective characters.

Figure 2:
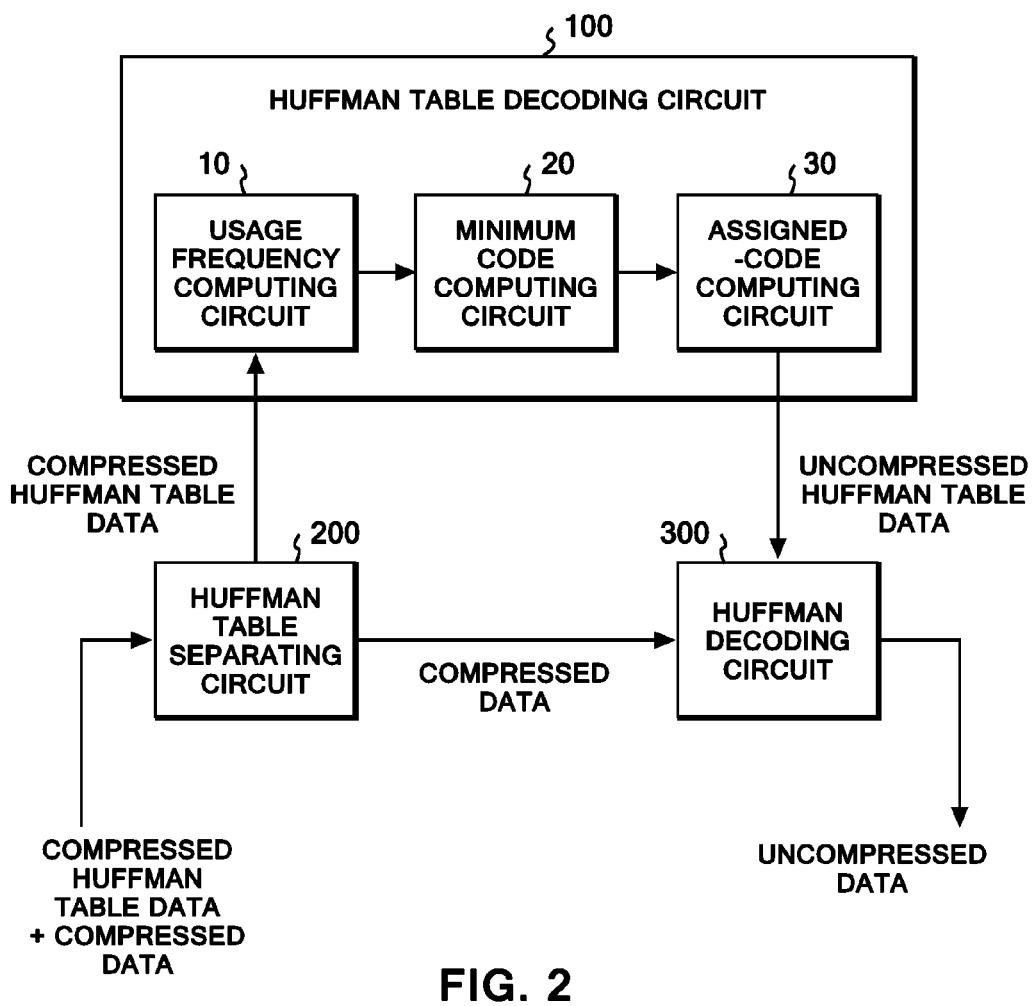
FIG. 2 is a diagram showing a configuration example of a Huffman decoder to which an embodiment of the present invention is applied.

FIG. 2 is a diagram showing a configuration example of a Huffman decoder in the embodiment of the present invention. This Huffman decoder may be exemplified as a communication device such as a router, the communication device, for example, being required to promptly execute processes of decompressing compressed data, performing virus check and the like, and compressing the data again. The Huffman decoder may also be a general computer such as a personal computer (PC). As shown in the drawing, the Huffman decoder includes a Huffman table decoding circuit 100, a Huffman table separating circuit 200 and a Huffman decoding circuit 300.

Among these constituent elements, the Huffman table decoding circuit 100 is configured to, when data in a Huffman table after compression (hereinafter, referred to as "compressed Huffman table data") is inputted thereto from the Huffman table separating circuit 200, decode the compressed Huffman table data, generate data in the Huffman table before compression (hereinafter, refer to as "uncompressed Huffman table data"), and output the uncompressed Huffman table data to the Huffman decoding circuit 300. Here, the compressed Huffman table data refers to data that includes only the bit lengths contained in the compressed Huffman table shown in FIG. 1. Here, the bit lengths are arranged in a sequence corresponding to characters listed in accordance with the ASCII code sequence in the Huffman table. Moreover, the uncompressed Huffman table data refers to data that includes only the codes contained in the uncompressed Huffman table shown in FIG. 1. Here, the codes are arranged in a sequence corresponding to characters listed in accordance with the ASCII code sequence in the Huffman table.

Note that this embodiment is not intended to exclude numerals and marks from what are referred to as "characters". In the following description, however, alphabets will be taken as an example of the characters for the sake of simplification. As shown in the drawing, the Huffman table decoding circuit 100 in this embodiment includes a usage frequency computing circuit 10, a minimum code computing circuit 20 and an assigned-code computing circuit 30. The usage frequency computing circuit 10 computes, when the compressed Huffman table data is inputted thereto, usage frequency of each bit length, that is, the number of alphabets corresponding to each bit length.

The minimum code computing circuit 20 computes a minimum code that is a code being minimum among codes assigned to each bit length on the basis of the usage frequency of each bit length that is computed by the usage frequency computing circuit 10. The assigned-code computing circuit 30 increments the minimum code determined by the minimum code computing circuit 20, by a value equal to the sequence number of each character in each group with the same bit length (hereinafter, referred to as same bit-length group), and assigns the finally-obtained code to the character. Additionally, upon receiving coded data including the compressed Huffman table data and compressed data, which has been compressed by replacing characters contained in data with codes assigned to the respective characters, the Huffman table separating circuit 200 separates this coded data into the compressed Huffman table data and the compressed data, and outputs the former data to the Huffman table decoding circuit 100 and the latter data to the Huffman decoding circuit 300.

Furthermore, the Huffman decoding circuit 300 changes the compressed data back to uncompressed data by replacing codes, which are included in the compressed data inputted from the Huffman table separating circuit 200, with respective characters to which the codes are assigned in the uncompressed Huffman table data inputted from the Huffman table decoding circuit 100. Then the Huffman decoding circuit 300 outputs the uncompressed data.

Operations of these three circuits will be described in detail below. Firstly, operations of these three circuits in general will be described as "a general Huffman table decoding method". Thereafter, operations of these three circuits in this embodiment will be described as "a Huffman table decoding method in this embodiment." Note that, in the following description, it is assumed that compressed Huffman table data "3, 3, 3, 3, 3, 2, 4, 4" is inputted to the Huffman table decoding circuit 100 in accordance with the example in FIG. 1. Additionally, while 286 characters and 15 bit lengths are defined in RFC 1951 at maximums, only eight alphabets and bit lengths up to four bits are shown as characters and bit lengths in this embodiment for the sake of simplification.

Figure 3:
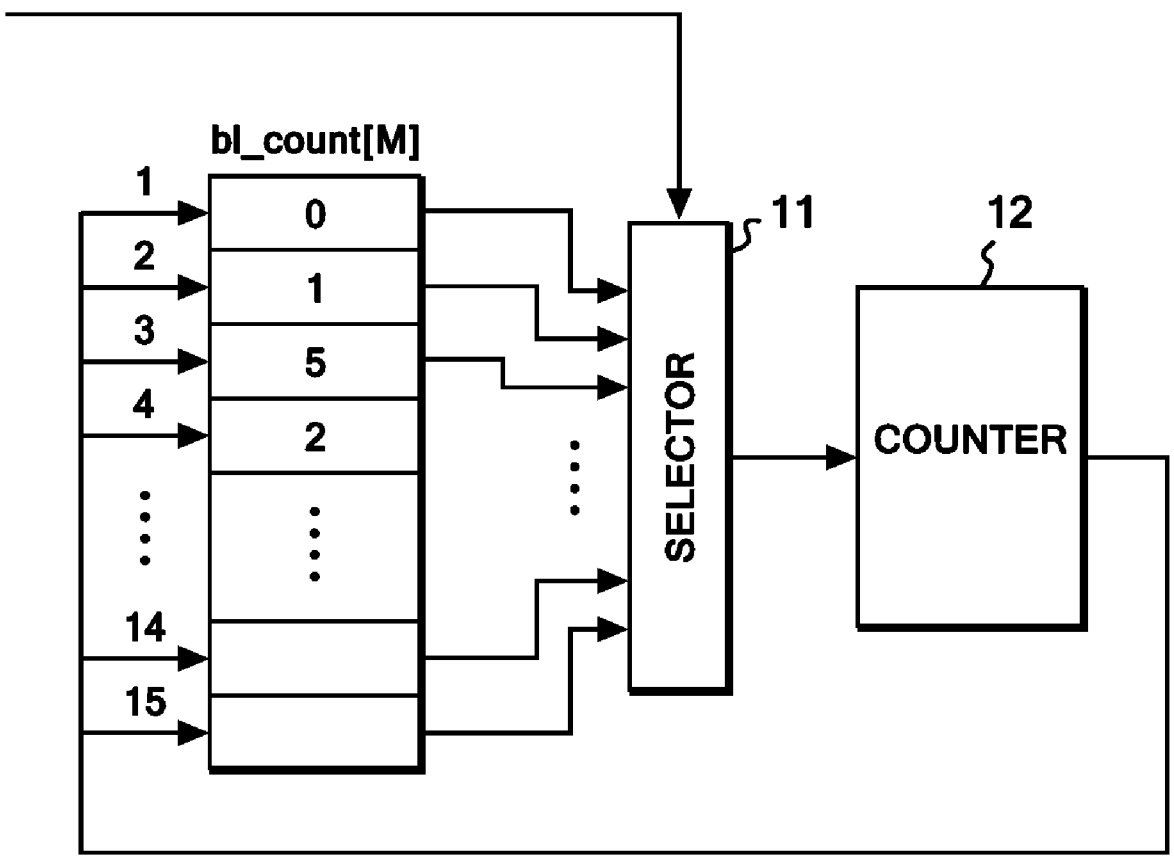
FIG. 3 is a diagram showing a configuration example of a usage frequency computing circuit of a general Huffman table decoding circuit.

FIG. 3 is a diagram showing a general example of the usage frequency computing circuit 10. The drawing indicates that the compressed Huffman table data "3, 3, 3, 3, 3, 2, 4, 4" has been inputted to the usage frequency computing circuit 10. In this case, it is assumed that one bit length in the compressed Huffman table data is inputted in one clock. Then, for each bit length inputted, a selector 11 retrieves a number stored at that time in bl_count[M] corresponding to the bit length. Then, a counter 12 stores a number obtained by adding "1" to the thus retrieved number into bl_count[M] from which the number has been retrieved. Thereby, a frequency at which the bit length is used is stored in bl_count[M] for each bit length inputted. In the example in the drawing, when all of the data has finished being inputted, "1", "5" and "2" are stored in bl_count[2], bl_count[3] and bl_count[4], respectively.

Figure 4:
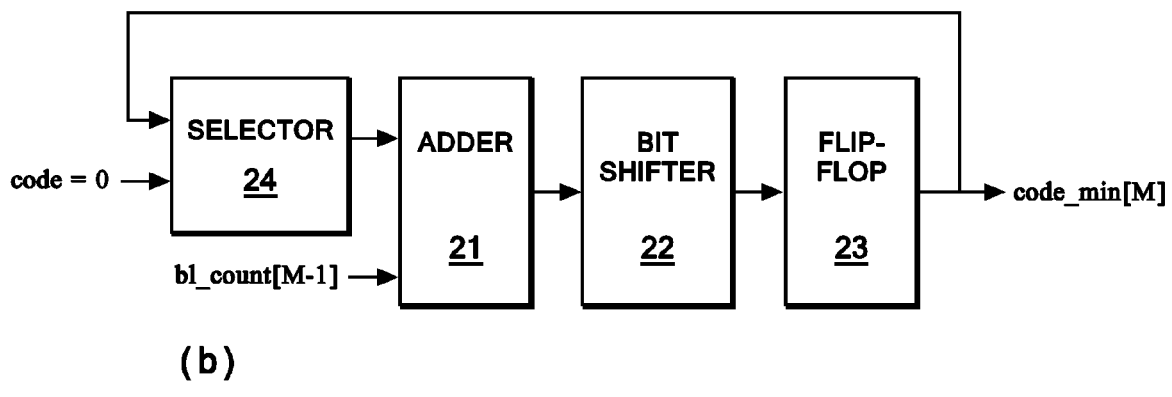
FIGS. 4A to 4C are diagrams showing a configuration example and the like of a minimum code computing circuit of a general Huffman table decoding circuit.

FIGS. 4A to 4C are diagrams provided for explaining a general example of the minimum code computing circuit 20. In this minimum code computing circuit 20, a minimum code (code_min) of each bit length is determined by mathematical expressions shown in FIG. 4A. Note that these expressions are defined in RFC 1951. Although details thereof will be omitted, it is necessary, in essence, to perform computation expressed by "code=(code+bl_count[bits−1])<<1". In addition, a circuit that computes code_min by use of these expressions can be easily configured through combination of an adder 21, a bit shifter 22, a flip-flop 23 and a selector 24 as shown in FIG. 4B. In other words, at a stage where M=1, the selector 24 selects a code "0", the adder 21 adds up this code to bl_count[0], the bit shifter 22 shifts a result of this addition by one bit to the left, the flip-flop 23 retains a result of the shifting, and the thus retained result is outputted as code_min [1]. Then, at a stage where M=2, the selector 24 selects the result retained in the flip-flop 23, the adder 21 adds up this result and bl_count[1], the bit shifter 22 shifts a result of this addition by one bit to the left, the flip-flop 23 retains a result of the shifting, and the thus retained result is outputted as code_min[2]. Thus, the circuit is configured to sequentially receive bl_count[M−1] and to sequentially output code_min [M].

Note that, in an example used in this embodiment, a minimum code code_min[M] of each bit length is as shown in FIG. 4C when computed by using the expressions shown in FIG. 4A. In this case, if the maximum bit length is denoted by B, a processing time is O(B). Although B equals 4 (clocks) in this example, a maximum value of B equals 15 (clocks) since the maximum bit length is defined as "15" in RFC 1951.

Figures 5, 6:
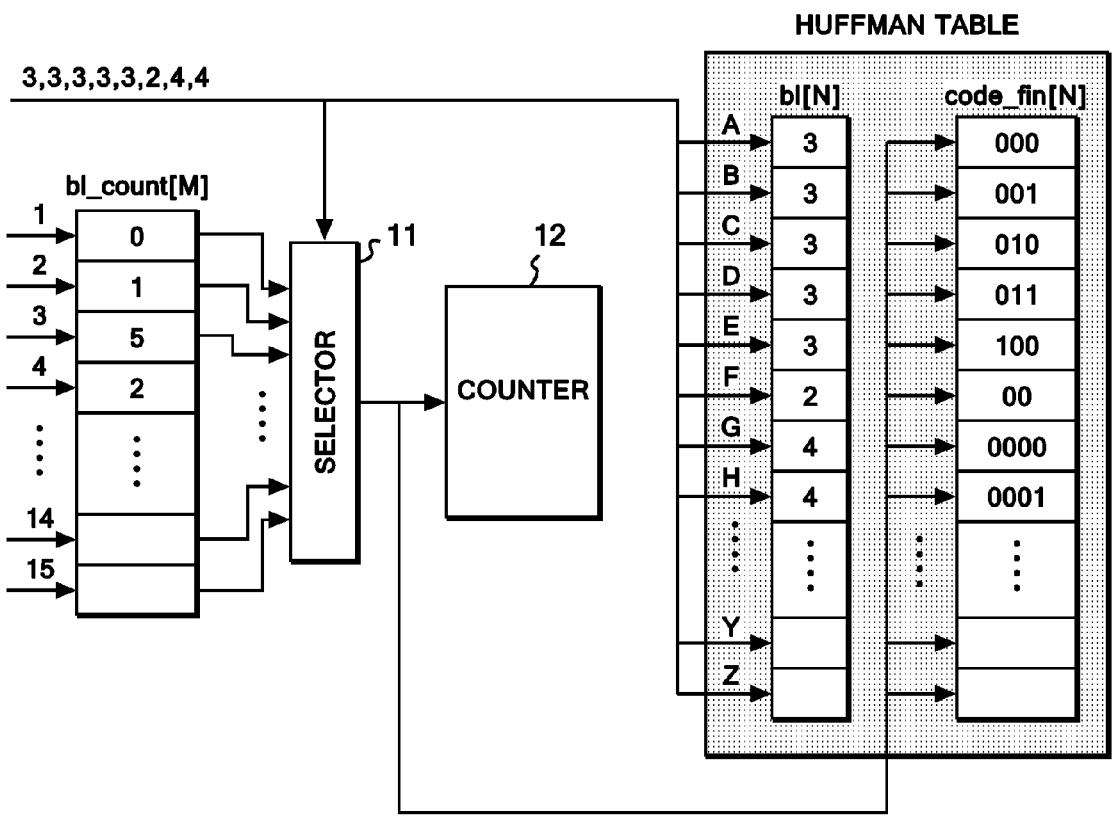
FIG. 5 is a diagram provided for explaining an assigned-code computing circuit of a general Huffman table decoding circuit.
FIG. 6 is a diagram showing a configuration example of a usage frequency computing circuit of a Huffman table decoding circuit in the embodiment of the present invention.

FIG. 5 is a diagram showing codes assigned to respective characters in addition to bit lengths assigned to the characters. Since an initial code of each bit length has been determined by the minimum code computing circuit 20, the assigned-code computing circuit 30 assigns codes to the respective characters in each bit-length group, the codes incriminated by "1" following the alphabetical order. In this case, a processing time is O(A). Although A equals 8 (clocks) in this example, A equals 286 (clocks) in a case where all of the 286 characters are subjected to the code assignment. Here, a throughput of this general Huffman table decoding method will be considered.

First of all, the usage frequency computing circuit 10 completes processing thereof only by passing data in a Huffman table as it is to the minimum code computing circuit 20. After completion of passing all of the data, however, the minimum code computing circuit 20 and the assigned-code computing circuit 30 require 15 clocks and 286 clocks respectively at maximums for processing. Therefore, it takes 301 clocks at a maximum to complete decoding of the Huffman table.

Decompression of compressed data can be smoothly performed if pipeline processes of decoding a Huffman table, decoding compressed data by use of the decoded Huffman table, and decoding a next Huffman table in parallel with this decoding of the compressed data can be smoothly performed. However, the pipeline processes cannot be smoothly performed on the condition that it takes 301 clocks at a maximum to obtain the uncompressed Huffman table after completion of passing all of the data. In other words, processing in the minimum code computing circuit 20 and in the assigned-code computing circuit 30 is a bottle neck in performing pipeline processes.

FIG. 6 is a diagram showing the usage frequency computing circuit 10 in this embodiment. In this embodiment, not only the number of alphabets in each bit length is counted as shown in FIG. 3, but also a value stored in bl_count[M] at that time is recorded into the Huffman table at the same time. In other words, for each bit length inputted, the selector 11 retrieves a value stored in bl_count[M] corresponding to the bit length at that time. Then, the counter 12 stores a value obtained by adding "1" to the thus retrieved value into bl_count[M] from which the value is retrieved. At the same time, the value retrieved by the selector 11 is stored into code_fin[N] of characters corresponding to the inputted bit length. In other words, the circuit in FIG. 3 is additionally provided with a circuit that writes, into the Huffman table, sequence numbers of respective characters in a same bit-length group.

Thereby, a sequence following the alphabetical order for a group of each bit length is stored in code_fin[N]. Although binary codes are shown in the drawing, the following will apply if these codes are explained in decimal codes. As for a group of codes having a bit length of "2,", "0" is stored into code_fin[6]. As for a group of codes having a bit length of "3,", "0", "1", "2", "3" and "4" are stored into code_fin[1], code_fin[2], code_fin[3], code_fin[4] and code_fin[5], respectively. As for a group of codes having a bit length of "4,", "0", "1" are stored into code_fin[7] and code_fin[8], respectively. Additionally, in this embodiment, a bit length is stored in bl[N] for each alphabet.

Note that: each of the value stored in bl_count[M] is one example of the number of strings assigned the same bit length; each of the value stored in bl[N] is one example of a bit length assigned to a string; and each of the value stored in code_fin[N] at this time is one example of a sequence number of a string in a sequence of strings assigned the same bit length. Additionally, in this embodiment, the usage frequency computing circuit 10 is provided as one example of a recording unit that records these pieces of information.

Figure 7:
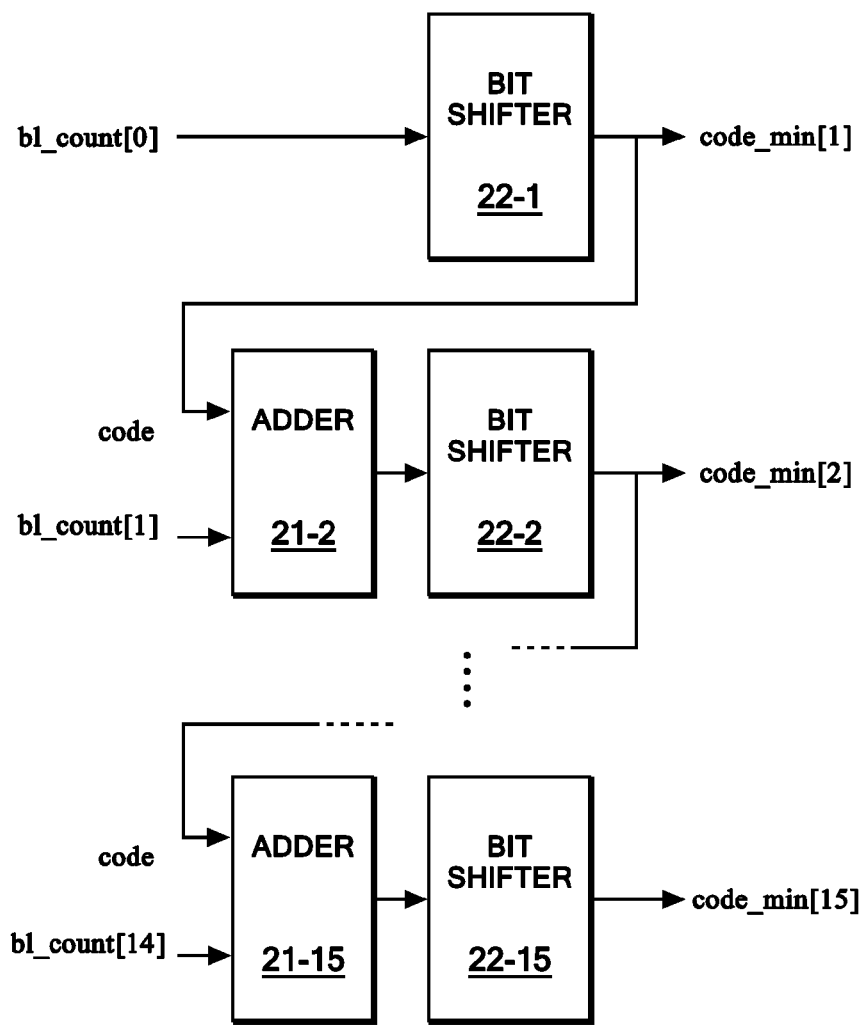
FIGS. 7A and 7B are diagrams showing a configuration example and the like of a minimum code computing circuit of the Huffman table decoding circuit in the embodiment of the present invention.

FIGS. 7A and 7B are diagrams provided for explaining the minimum code computing circuit 20 in this embodiment. In this minimum code computing circuit 20 also, a minimum code (code_min) of each bit length is determined by the expressions shown in FIG. 4A. Although being the same as the one shown in FIG. 4C, these minimum codes (code_min) are shown in FIG. 7A again. In this embodiment, however, the minimum codes (code_min) are computed by a parallel computing circuit in contrast to FIGS. 4A to 4C.

FIG. 7B shows one example of the parallel computing circuit. In a circuit in the first stage of this parallel computing circuit, a bit shifter 22-1 performs computation in which bl_count[0] is shifted by one bit to the left thereby obtaining code_min[1]. Then, this code_min[1] is directly inputted to an adder 21-2 without being retained by a flip-flop. Additionally, in a circuit in the second stage, the adder 21-2 adds up code_min[1] and bl_count[1], and a bit shifter 22-2 performs a computation in which a result of this addition is shifted by one bit to the left thereby obtaining code_min[2]. Then, this code_min[2] is inputted to an adder in the next stage without being retained by a flip-flop. Thereafter, the same computation as above is performed iteratively, and in the fifteenth stage, an adder 21-15 adds up code_min[14] and bl_count [14], and a bit shifter 22-15 performs a computation in which a result of this addition is shifted by one bit to the left thereby obtaining code_min[15]. In this parallel computing circuit, all of minimum codes can be computed even in one clock if results of computation in the respective stages pass through the fifteen stages of circuits sufficiently fast. Furthermore, since this circuit is a relatively simple circuit, all of the codes can be more reliably computed in one clock if this circuit is sufficiently optimized.

Therefore, an optimization method in this case will be described. A critical path (a maximum delay) in the circuit in FIG. 7B is code_min[15]. Therefore, computation of code_min[15] is optimized. FIG. 8A is a diagram showing a computation process of code_min[15] according to the mathematical expressions in FIG. 4A. Here, BK denotes a value of each bit of bl_count[K], and C15 denotes a value of each bit of code_min[15]. Although values of the respective bits are denoted by the same signs BK and C15, this does not means that values of the respective bits denoted by each of the same signs are equal to one another. As is seen from the drawing, code_min[15] is found by adding up results each obtained by shifting bl_count[K] by (15−K) bits to the left (K=1, 2, 3, . . . , 14).

Likewise, code_min[14] is found by adding up results each obtained by shifting bl_count[K] by (14−K) bits to the left (K=1, 2, 3, . . . , 13), and code_min[13] is found by adding up results each obtained by shifting bl_count[K] by (13−K) bits to the left (K=1, 2, 3, . . . , 12). In other words, code_min[M] is generally found by adding up results each obtained by shifting bl_count[K] by (M−K) bits to the left (K=1, 2, 3, . . . , M−1, and M=2, . . . , 15). Accordingly, code_min[M] can be computed in parallel.

Since the maximum number of characters defined in RFC 1951 is 286, a maximum value of values stored in bl_count [M] is 286. In other words, each of the stages in FIG. 8A is effective only up to nine bits. FIG. 8B is a diagram into which FIG. 8A is rewritten in consideration of this issue. An adder that performs the above described addition has a circuit size with which the processing can be sufficiently completed in one clock. Note that values stored in code_min[M], that is, the minimum codes, are one example of base codes that are codes each used as a base for codes having the same bit lengths. Additionally, in this embodiment, the minimum code computing circuit 20 is provided as one example of a base code generating unit that generates the base codes.

FIG. 9 is a diagram showing, in addition to bit lengths assigned to respective characters, computation equations through which codes assigned to the respective characters are computed, and the codes computed through the computation equations. In other words, in this embodiment, sequence numbers for respective alphabets in a same bit-length group are already stored into code_fin[N] in the Huffman table by the usage frequency computing circuit 10. Therefore, as shown in a column for the computation equations, the assigned-code computing circuit 30 adds, to this code_fin[N], minimum codes which are computed by the minimum code computing circuit 20 and correspond to bit lengths.

Figure 10:
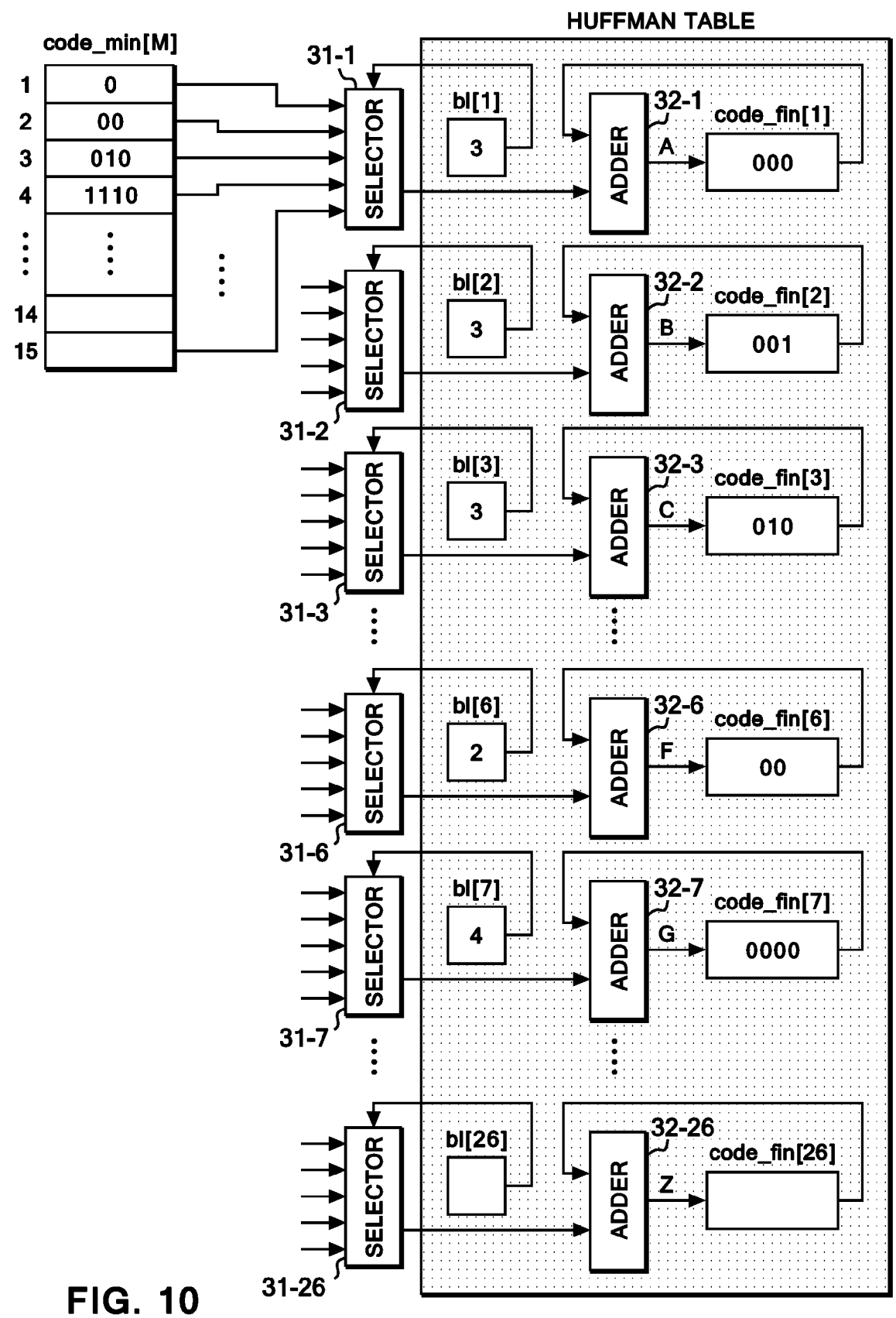
FIG. 10 is a diagram showing a configuration example of the assigned-code computing circuit of the Huffman table decoding circuit in the embodiment of the present invention.

FIG. 10 shows one example of a parallel adder that performs the above described processing in parallel. In this parallel adder, a selector 31-1 retrieves a value "010" stored in a minimum code code_min[3] corresponding to a bit length "3" stored in bl[1]. Then, an adder 32-1 adds the value "010" stored in the minimum code code_min[3] to a value "000" stored in code_fin[1], and sets a result of this addition as a code assigned to "A" which is the first character in the Huffman table.

Additionally, a selector 31-2 retrieves a value "010" stored in a minimum code code_min[3] corresponding to a bit length "3" stored in bl[2]. Then, an adder 32-2 adds the value "010" stored in the minimum code code_min[3] to a value "001" stored in code_fin[2], and sets a result of this addition as a code assigned to "B" which is the second character in the Huffman table.

Furthermore, a selector 31-3 retrieves a value "010" stored in a minimum code code_min[3] corresponding to a bit length "3" stored in bl[3]. Then, an adder 32-3 adds the value "010" stored in the minimum code code_min[3] to a value "010" stored in code_fin[3], and sets a result of this addition as a code assigned to "C" which is the third character in the Huffman table.

Additionally, a selector 31-6 retrieves a value "00" stored in a minimum code code_min[2] corresponding to a bit length "2" stored in bl[6]. Then, an adder 32-6 adds the value "00" stored in the minimum code code_min[2] to a value "00" stored in code_fin[6], and sets a result of this addition as a code assigned to "F" which is the sixth character in the Huffman table.

Furthermore, a selector 31-7 retrieves a value "1110" stored in a minimum code code_min[4] corresponding to a bit length "4" stored in bl[7]. Then, an adder 32-7 adds the value "1110" stored in the minimum code code_min[4] to a value "0000" stored in code_fin[7], and sets a result of this addition as a code assigned to "G" which is the seventh character in the Huffman table.

All of the computation described in connection with FIG. 9 is thus performed by the parallel computing circuit, whereby the processing thereof is completed in one clock. Note that values stored in code_fin[N] at this point are one example of the plural codes. Additionally, in this embodiment, the assigned-code computing circuit 30 is provided as one example of an assignment-code generating unit that generates the plural codes.

Here, a throughput of the Huffman table decoding method in this embodiment will be considered. First of all, the usage frequency computing circuit 10 completes processing thereof only by passing data in a Huffman table as it is to the minimum code computing circuit 20. After completion of passing all of the data, each of the minimum code computing circuit 20 and the assigned-code computing circuit 30 can complete processing thereof in one clock cycle. Therefore, decoding of the Huffman table can be completed in two clock cycles in total. Accordingly, the pipeline processes can be smoothly performed.

Figure 11:
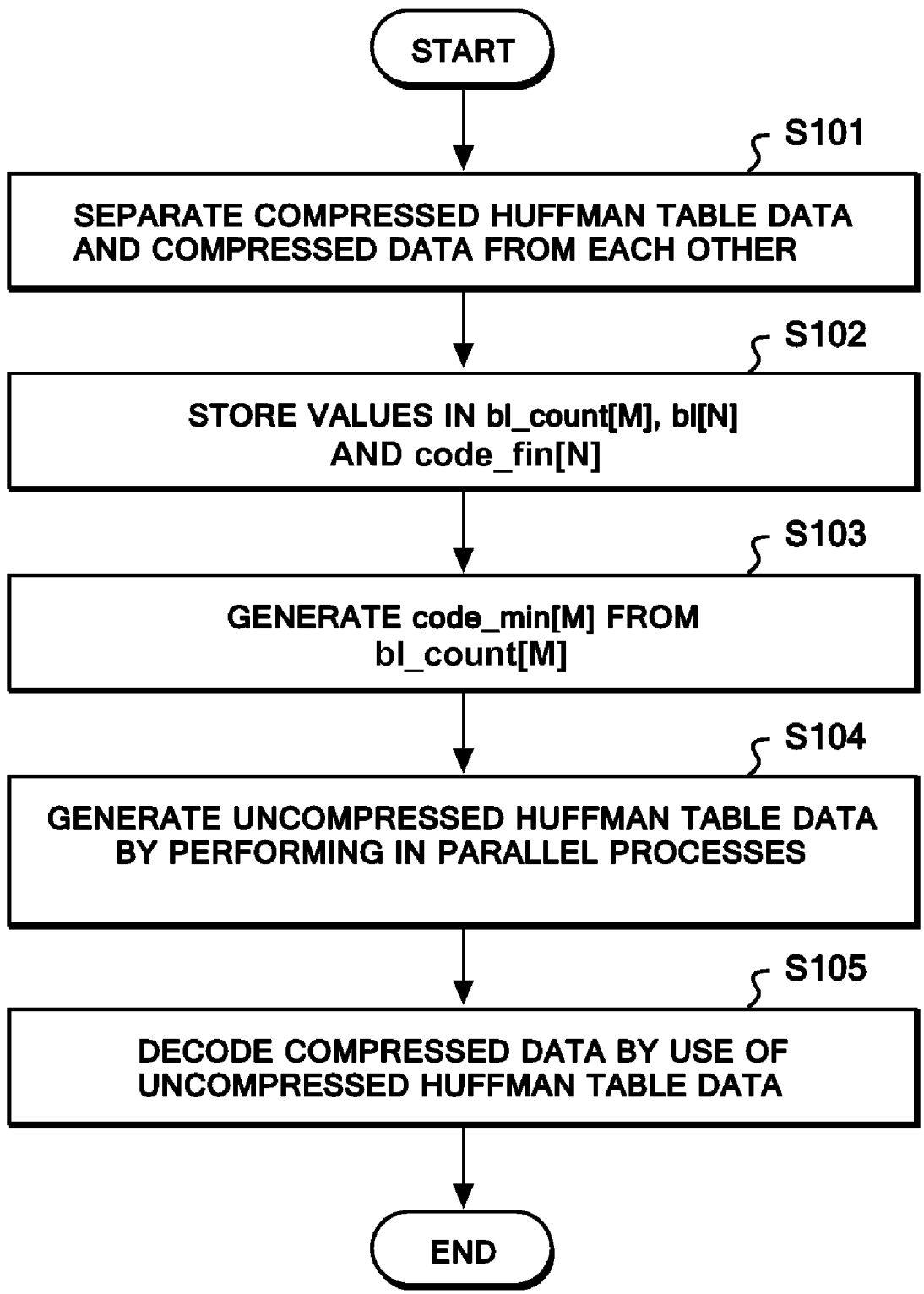
FIG. 11 is a flowchart showing an example of operations of the Huffman decoder in the embodiment of the present invention.

Finally, a flow of operations of the Huffman decoder in this embodiment will be described. FIG. 11 is a flowchart showing an exemplary flow of operations. As shown in the drawing, in the Huffman decoder in this embodiment, upon receiving coded data consisting of compressed Huffman table data and compressed data, the Huffman table separating circuit 200 separates the compressed Huffman table data and the compressed data from each other (step 101).

Subsequently, in the Huffman table decoding circuit 100, the usage frequency computing circuit 10 sequentially retrieves bit lengths assigned to characters from the Huffman table, and stores values in bl_count[M], bl[N] and code_fin [N] (step 102). Additionally, the minimum code computing circuit 20 generates code_min[M] on the basis of bl_count [M] (step 103). Furthermore, the assigned-code computing circuit 30 generates uncompressed Huffman table data in which codes are assigned to respective characters by performing in parallel processes in each of which a value stored in code_fin[N] is added to a minimum code specified by bl[N] from among minimum codes stored in code_min[M] (step 104).

Thereafter, the Huffman decoding circuit 300 generates uncompressed data by replacing codes contained in the compressed data with characters assigned the respective codes by use of the uncompressed Huffman table data (step 105).

As has been described above, this embodiment employs a configuration which includes the three steps of (1) computing a frequency at which each bit length is used, (2) computing a minimum code in each bit length, and (3) assigning codes. Here, when the sequence number of each of characters in a same bit-length group is determined in step (1) and when the minimum codes are computed in step (2), the sequence number of each character and corresponding one of the minimum codes are added up in step (3). Parallel computation can be executed in this configuration. Thereby, a processing time for step (3) can be reduced. Additionally, computation of minimum codes in step (2) is also configured to be executed by use of the parallel computing circuit. Thereby, a processing time for step (2) can be reduced.

As will be appreciated by one of ordinary skill in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," "process" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, or entirely on the remote computer or server. In the last scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments of the present invention have been illustrated in detail, one of ordinary skill in the art will appreciate that modifications and adaptations to those embodiments may be made without departing from the scope of the present invention as set forth in the following claims.

What is claimed is:

1. A method for converting a plurality of bit lengths, each assigned to a plurality of strings, into a plurality of codes respectively having the plurality of bit lengths, comprising:
in response to input of the plurality of bit lengths, recording a number of strings assigned each of the bit lengths, a bit length assigned to each of the strings, and a sequence number of each string in a group of strings assigned each of the bit lengths;

generating a plurality of base codes on the basis of the numbers of the recorded strings, the plurality of base codes each being a code used as a base for codes having the same one of the bit lengths; and generating the plurality of codes by performing in parallel a plurality of processes respectively for the plurality of strings, one of the processes for each of the strings being based on:

one of the plurality of generated base codes, the one of the plurality of generated base codes having the bit length assigned to the string, and the sequence number for the string in the group of the strings assigned the bit length.

2. The method according to claim 1, further including, in response to input of a particular one of the plurality of bit lengths assigned to a particular string, updating a number of strings assigned a same bit length as the particular bit length, and retaining, for the particular string, the particular bit length and the number of strings assigned the same bit length as the particular bit length for at least one of before and after the update.

3. The method of claim 1, wherein:

the generating the plurality of base codes is performed by a parallel computing circuit including a plurality of stages of circuits, and each of the stages of circuits is a circuit adapted for:

adding up two bit strings, one of which is obtained by shifting, by one bit to the left, a bit string representing the number of strings assigned a first bit length, and the other of which represents the number of strings assigned a second bit length longer by one bit than the first bit, and shifting the bit string obtained by the above addition by one bit to the left.

4. The method according to claim 1, further including:

generating the plurality of base codes by performing in parallel a predetermined number of processes for a predetermined number of bit lengths, respectively, wherein one of the predetermined number of processes for a bit length M (M is a natural number) is a process of shifting a bit string representing the number of strings assigned each bit length K (K is a natural number 1, 2, . . . , M−1) by (M−K) bits to the left, and adding up the bit strings thus obtained by the shift for all the bit lengths K.

5. A system for converting a plurality of bit lengths, each assigned to a plurality of strings, into a plurality of codes respectively having the plurality of bit lengths, comprising:

a processor device, wherein the processor device is adapted for:

in response to input of the plurality of bit lengths, recording a number of strings assigned each of the bit lengths, a bit length assigned to each of the strings, and a sequence number of each string in a group of strings assigned each of the bit lengths, generating a plurality of base codes on the basis of the numbers of the recorded strings, the plurality of base codes each being a code used as a base for codes having the same one of the bit lengths, and generating the plurality of codes by performing in parallel a plurality of processes respectively for the plurality of strings, one of the processes for each of the strings being based on one of the plurality of generated base codes, the one of the plurality of base codes having the bit length assigned to the string, and the sequence number for the string in the group of the strings assigned the bit length.

6. The system according to claim 5, wherein the processor device is further adapted for, in response to input of a particular one of the plurality of bit lengths assigned to a particular string, updating a number of strings assigned a same bit length as the particular bit length, and retaining, for the particular string, the particular bit length and the number of strings assigned the same bit length as the particular bit length for at least one of before and after the update.

7. The system according to claim 5, wherein the processor device includes a parallel computing circuit adapted for performing the generating the plurality of base codes, the parallel computing circuit having a plurality of stages of circuits, further wherein each of the stages of circuits is a circuit adapted for:

adding up two bit strings, one of which is obtained by shifting, by one bit to the left, a bit string representing the number of strings assigned a first bit length, and the other of which represents the number of strings assigned a second bit length longer by one bit than the first bit, and shifting the bit string obtained by the above addition by one bit to the left.

8. The system according to claim 5, wherein the processor device is further adapted for:

generating a predetermined number of base codes by performing in parallel a predetermined number of processes for a predetermined number of bit lengths, respectively, wherein one of the predetermined number of processes for a bit length M (M is a natural number) is a process of shifting a bit string representing the number of strings assigned each bit length K (K is a natural number 1, 2, . . . , M−1) by (M−K) bits to the left, and adding up the bit strings thus obtained by the shift for all the bit lengths K.

9. A computer program product for computing a plurality of bit lengths, each assigned to a plurality of strings, into a plurality of codes respectively having the plurality of bit lengths, the computer program product comprising a computer-readable storage medium having computer-readable program code portions stored therein, the computer-readable program code portions comprising:

a first executable portion for, in response to input of the plurality of bit lengths, recording a number of strings assigned each of the bit lengths, a bit length assigned to each of the strings, and a sequence number of each string in a group of strings assigned each of the bit lengths;

a second executable portion for generating a plurality of base codes on the basis of the numbers of the recorded strings, the plurality of base codes each being a code used as a base for codes having the same one of the bit lengths; and a third executable portion for generating the plurality of codes by performing in parallel a plurality of processes respectively for the plurality of strings, one of the processes for each of the strings being based on:

one of the plurality of generated base codes, the one of the plurality of base codes having the bit length assigned to the string, and the sequence number for the string in the group of the strings assigned the bit length.

10. The computer program product according to claim 9, further including a fourth executable portion for, in response to input of a particular one of the plurality of bit lengths assigned to a particular string, updating a number of strings assigned a same bit length as the particular bit length, and retaining, for the particular string, the particular bit length and the number of strings assigned the same bit length as the particular bit length for at least one of before and after the update.

11. The computer program product of claim 9, wherein:
the second executable portion for the generating the plurality of base codes is adapted to be performed by a parallel computing circuit including a plurality of stages of circuits, and
each of the stages of circuits is a circuit adapted for:
adding up two bit strings, one of which is obtained by shifting, by one bit to the left, a bit string representing the number of strings assigned a first bit length, and the other of which represents the number of strings assigned a second bit length longer by one bit than the first bit, and
shifting the bit string obtained by the above addition by one bit to the left.

12. The computer program product of claim 9, further including a fourth executable portion for:
generating the plurality of base codes by performing in parallel a predetermined number of processes for a predetermined number of bit lengths, respectively, wherein one of the predetermined number of processes for a bit length M (M is a natural number) is a process of shifting a bit string representing the number of strings assigned each bit length K (K is a natural number $1, 2, \ldots, M-1$) by (M-K) bits to the left, and
adding up the bit strings thus obtained by the shift for all the bit lengths K.

13. A method for converting a plurality of bit lengths, each assigned to a plurality of strings, into a plurality of codes respectively having the plurality of bit lengths, comprising:
in response to input of a particular one of the plurality of bit lengths assigned to a particular one of the plurality of strings, updating a number of strings assigned a same bit length as the particular bit length, and retaining, for the particular string, the particular bit length and the number of strings assigned a same bit length as the particular bit length before or after the update, thereby recording the number of strings assigned each of the bit lengths, a bit length assigned to each of the strings, and a sequence number of each string in a group of strings assigned each of the bit lengths;
generating, for a predetermined number of bit lengths that are the plurality of bit lengths different from one another, a predetermined number of minimum codes each being a minimum one of codes having the same one of the bit lengths by performing in parallel a predetermined number of processes, one of the predetermined number of processes for a bit length M (where M is a natural number) being a process of shifting a bit string representing the number of strings, which is recorded as one assigned each bit length K (K is a natural number $1, 2, \ldots, M-1$), by (M-K) bits to the left, and adding up the bit strings thus obtained by the shift for all the bit lengths K; and
generating the plurality of codes by performing in parallel a plurality of processes respectively for the plurality of strings, one of the plurality of processes for each of the strings being a process of adding up:
one of the predetermined number of minimum generated codes, the one of the predetermined minimum generated codes having the bit length assigned to the string, and
the sequence number for the string in the group of the strings assigned the bit length.

* * * * *